Nov. 11, 1969 N. C. WALKER 3,478,275

AMPLIFIER SYSTEM WITH POWER SUPPLY CONTROL FOR BALANCED POWER

Filed Jan. 21, 1966

INVENTOR
NORMAN C. WALKER

BY Wilson, Robbins + Anderson
ATTORNEYS

United States Patent Office 3,478,275

Patented Nov. 11, 1969

3,478,275

AMPLIFIER SYSTEM WITH POWER SUPPLY CONTROL FOR A BALANCED POWER

Norman C. Walker, Newport Beach, Calif., assignor to Dana Laboratories, Inc., Irvine, Calif., a corporation of California Filed Jan. 21, 1966, Ser. No. 522,208
Int. Cl. H03f 3/04, 3/68
U.S. Cl. 330—22 10 Claims

ABSTRACT OF THE DISCLOSURE

An amplifier (including a pair of interconnected transistor devices) is connected to receive an input signal and applied power from a power supply. An isolation circuit senses the operating level of the amplifier and accordingly adjusts the power supply without ohmic connection. Specifically, as disclosed, the middle or center of the power supply is varied to a level in accordance with the operating level of the amplifier.

Figure 1:
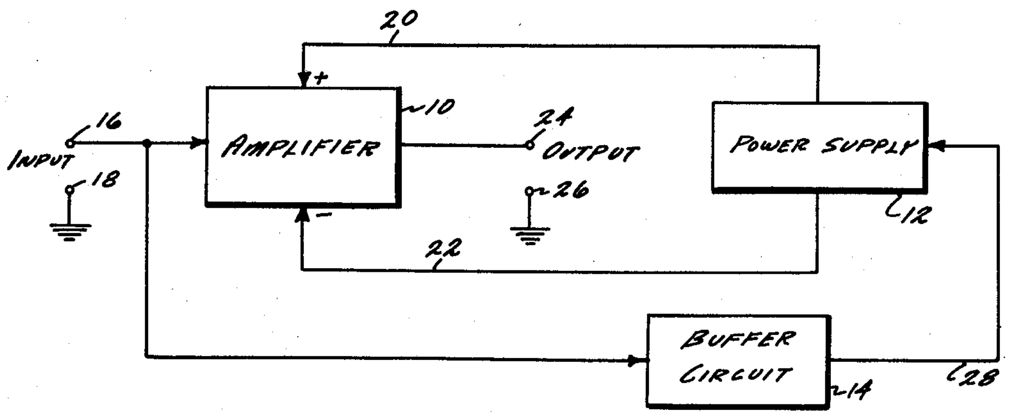

The present invention relates to amplifiers and more particularly to a system in which an amplifier is operated in a balanced manner for greater precision, by controlling the mean operating level of the energizing power applied to the amplifier.

With various developments in certain phases of the prior art, operational amplifiers have come into general use in a wide variety of different applications. For example, these amplifiers are employed in many computation, control and instrumentation systems, as well as in many specific functional circuits, as converters, oscillators and the like.

Normally, the precision of an operational amplifier is a matter of concern in most applications. Therefore, virtually any improvement in the basic circuit system which improves the precision of an operational amplifier without a commensurate increase in cost is quite a significant advancement.

Sources of error normally present in an operational amplifier stem, for example, from variations in operating level and unbalance in the system. That is, at different levels of input signal, an amplifier operates at different points on the characteristic curve of the circuit. In view of the invariable non-linear nature of such characteristic curves, errors are introduced. In the past, considerable effort has been spent in striving for amplifiers with more linear characteristic curves. In general, several significant improvements in that direction have resulted; however, at the present state of the art, structural amplifier improvements which result in systems approaching truly linear operation are quite expensive and often delicate. Therefore, a considerable need exists for a relatively inexpensive amplifier system in which the usual errors resulting from non-linearity are substantially reduced.

Accordingly, it is an object of the present invention to provide an amplifier system which is relatively more precise in operation, and which can be economically embodied in a relatively rugged and durable structure.

It is another object of the present invention to provide an improved operational amplifier which operates with relatively good precision over a relatively wide range of input signal variations.

It is another object of the present invention to provide an operational amplifier system which incorporates dual electron discharge devices, e.g. transistors, that are preserved in a state of balance in relation to the power supplied thereto.

It is another object of the present invention to provide an operational amplifier system which includes means for controlling the mean operating level of the power that is supplied, to thereby accomplish greater precision in amplifier operation.

Figure 2:
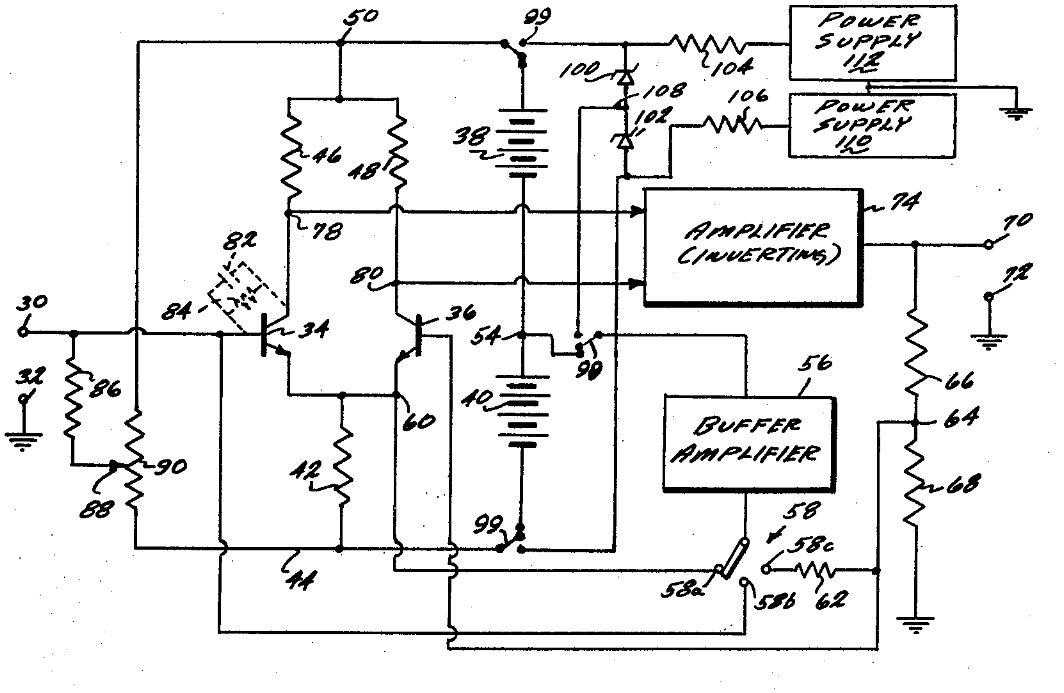

Additional objects and advantages of the present invention will become apparent from a consideration of the following description taken in conjunction with the accompanying drawings which are presented by way of example only and are not intended as a limitation upon the scope of the present invention as defined in the appended claims, and in which:

FIGURE 1 is a schematic circuit diagram in block form of an operational amplifier in accordance with the present invention; and FIGURE 2 is a schematic circuit diagram illustrating an embodiment of the present invention in greater detail.

An operational amplifier in accordance with the present invention comprises at least one amplifier stage which is driven by an input signal to derive a related output signal from an applied power supply. The potential of the power supply is then adjusted to various mean operating levels by an isolation circuit that senses a control or level-setting signal in accordance with the operating level of the amplifier. For example, the input signal may be employed to control the operating power level of the amplifier thereby preserving the amplifier in a balanced operating mode at a somewhat established location on the amplifier characteristic curve.

Considering the system hereof in greater detail, reference will now be made to FIGURE 1 showing blocks representative of an amplifier 10, a power supply 12 and a buffer circuit 14. The amplifier 10 may take a wide variety of different forms and is connected to receive an input signal that is applied between a terminal 16 and a cooperating grounded terminal 18. The operating power for the amplifier 10 is then supplied from the power supply 12 by a positive bus 20 and a negative bus 22. A potential that is representative of the signal applied at the terminal 16 is derived by the amplifier 10 from the potential supplied by the power supply 12 and appears at an output terminal 24 referenced to a grounded terminal 26.

The input signal applied to the amplifier 10 from the terminal 16 is also applied to the buffer circuit 14 which may comprise an isolation amplifier having unity gain. The output from the buffer circuit is connected to the power supply 12 through a conductor 28 which is connected to a center tap or mean potential level within the power supply. The power supply may, for example, comprise two batteries interconnected (positive to negative) to provide a total operating potential difference for the amplifier 10. In such a system, the biasing or level control conductor 28 may be connected to the junction point between the batteries, or to either terminal. As a result, the potential difference provided by the batteries tracks in accordance with the operating level of the amplifier 10, e.g. in accordance with the level of the input signal applied to the terminal 16. Other signals within the system can be employed to establish the mean operating level of the power supply (as described below) so that the system and specifically the amplifier 10 operates in an accurate stabilized manner.

In addition to the basic considerations made with reference to the diagram of FIGURE 1, the system hereof has further significance for certain specific forms of amplifiers, as for example a balanced operational instrumentation amplifier as shown in FIGURE 2, which will now be considered in detail. An input signal is applied across a pair of terminals 30 and 32, as for control or other purposes. The terminal 32 is connected to ground potential while the terminal 30 is connected to the base of an input transistor 34 which operates as an amplifier in balanced cooperation with another transistor 36. The transistors 34 and 36 are somewhat similarly connected to a power supply, represented in FIGURE 2 as a pair of ungrounded interconnected batteries 38 and 40. Specifically, the emitters of the transistors 34 and 36 are connected through a common resistor 42 to a power supply bus 44 which is connected to the negative terminal of the battery 40. The collectors of the transistors 34 and 36 are then individually connected through resistors 46 and 48 respectively to a positive bus 50 which is connected to the positive side of the battery 38.

Regarding the batteries 38 and 40, it is to be noted that the negative side of the battery 38 is connected to the positive side of the battery 40 at a junction point 54 to which a buffer amplifier 56 is also connected to establish the mean operating level of the power supply, e.g. the batteries 38 and 40. The buffer amplifier 56 may comprise a unity-gain isolation amplifier, and provides a level-setting, tracking control or boot strap potential to the junction point 54 from any of a variety of points depending upon the position of a switch 58.

The movable contact of the switch 58 is connected to the buffer amplifier 56 so as to connect that amplifier to any of three input source points in accordance with the position of the movable contact. Specifically, a stationary contact 58*a* is connected to a junction point 60 of the emitter electrodes of the transistors 34 and 36 to provide an emitter-follower signal. The stationary contact 58*b* of the switch is connected to the terminal 30 to provide the amplifier input signal, and the stationary contact 58*c* is connected through a resistor 62 (or directly) to a junction point 64 between a pair of serially-connected resistors 66 and 68. These resistors provide a voltage divider for the output signal appearing between output terminals 70 and 72. Specifically, the terminal 72 is connected to ground while the terminal 70 is connected to receive the output of an amplifier 74 which receives signals from the collectors of the transistors 34 and 36 providing a differential signal.

In view of the above preliminary description of the system of FIGURE 2, a full understanding thereof may now best be accomplished by considering the operation of the system under certain assumed conditions, and explaining certain of the elements in greater detail concurrently with the explanation of the operation. Basically, the transistor 34 and 36 are operated to maintain a balanced state. Assuming an initial balance, further assume that the input signal applied between the terminals 30 and 32 becomes more positive. As a result, the collector-emitter current in the transistor 34 increases driving the junction point 78 to a lower potential (less positive or more negative). As a result, a potential difference is developed between the junction point 78 and a junction point 80 at the collector of the transistor 36. This potential difference is applied as a differential signal to the amplifier 74 which may comprise a phase-inverting amplifier that provides an output signal to the terminal 70 in accordance with the potential difference between the junction points 78 and 80.

A portion of the output signal appearing at the terminal 70 from the amplifier 74, is provided from the voltage dividing resistors 66 and 68 back to the base of the transistor 36. As a result of the signal-inverting and amplification operation of the amplifier 74, the feedback signal is of higher potential (more positive or less negative) thus very nearly coinciding with the assumed change in the applied input signal. As a result, the transistors 34 and 36 are restored to a balanced state of operation.

In the operation of prior systems of this type, the impedance of the elements, as that of the transistor 34 may produce significant errors. That is, for example, the transistor 34 has inter-electrode capacitance and resistance between the base and collector as indicated in phantom by a capacitor 82 and a resistor 84. Furthermore, other impedances are also frequently present, as for example in the embodiment of FIGURE 2, an input resistor 86 is connected to the movable tap 88 of a potentiometer 90. Such an arrangement has been employed in the past with the objective of balancing input current. In the operation of such a system, without the improvements hereof, errors are produced as a result of these impedances producing imbalance. However, according to the present invention, the technique of shifting the mean level of the power supply as described, in accordance with the input signal, for example, causes the various impedances which may produce spurious error signals, to be held unloaded and the system remains in a state of balance.

As indicated, the control or level-setting signal may be taken from various points within the system. As considered with reference to FIGURE 1, the control signal may simply comprise the amplifier input signal. For such operation, the movable contact of the switch 58 (FIGURE 2) is set to engage the stationary contact 58*b* which is connected directly to the input terminal 30. In alternative modes of operation, the movable contact of the switch 58 may be engaged with either of the stationary contacts 58*a* or 58*c* to provide the mean level of the power supply at a location established by the operating level of the amplifier. Specifically, the stationary contact 58*a* is connected to the junction point 60 of the common emitter connection of the transistors 34 and 36. The potential at the junction point 60 varies as the input signal in an emitter-follower fashion. Therefore, the signal from the junction point 60 serves in a manner similar to the input signal to adjust the mean operating level of the power supply through the buffer amplifier 56.

In the event that the movable contact of the switch 58 is set to engage the stationary contact 58*c*, then the control or level-setting signal is derived from the output signal of the system. That is, the voltage divider including the resistors 66 and 68 provide a scaled-down representation of the output signal at the junction point 64. Variations in the signal at the junction point 64 coincide in polarity or sense to the input signal as a result of one inversion by the transistor 34 and another by the amplifier 74 and by the fact feedback makes the junction point 64 follow the terminal 30 very closely. As a result, the signal developed at the junction point 64 is applied to the base of the transistor 36 to reestablish balanced operation. Furthermore, application of that signal to the junction point 80 between the batteries 38 and 40 (via the buffer amplifier 56) also controls the power supply for the tracking mode of operation as described herein.

It is to be noted, that the power supply may take various forms other than a pair of batteries. For example, Zener diodes as well-known in the art may be employed to provide the desired voltage with an intermediate tap. One such arrangement is shown in FIGURE 2, which would avoid use of the batteries 38 and 40 by reversing switches 99. A pair of Zener diodes 100 and 102 are similarly poled and serially connected with a pair of resistors 104 and 106 across a pair of power supplies 112 and 110 adapted to be connected each with a common point to ground.

The operation of this alternative arrangement is basically similar to that previously described. The tracking control or level-setting signal is sensed from one of the control points as selected by the switch 58. That control signal is then applied through the non-inverting isolation buffer amplifier 56 to a junction point 108 between the diodes to establish the mean or intermediate potential level of the fixed potential difference across the diodes 100 and 102 which serves to power the amplifier, i.e. the circuit of transistors 34 and 36.

There has thus been described an operational amplifier system capable of precise operation, yet which may be inexpensively and simply manufactured.

I claim:

1. An amplifier system for providing a variable output potential in accordance with an input signal, comprising:

a power supply means for providing a potential difference;

electron discharge means connected to receive said potential difference and said input signal for accordingly providing said variable output from drive power of said potential difference; and buffer circuit means for sensing a potential level from said electron discharge means and accordingly biasing the operating level of said power supply means whereby to balance the operation of said electron discharge means in a predetermined manner, said buffer circuit being an isolation means to isolate said power supply from said electron discharge means.

2. A system according to claim 1 wherein said electron discharge means comprises a pair of interconnected transistor devices and circuit means whereby said devices are to be operated in a balanced mode and wherein said power supply includes a mid-potential center junction and further, wherein said center junction is biased to establish the operating level of said power supply.

3. A system according to claim 1 wherein said power supply means includes diode regulator devices.

4. A system according to claim 1 wherein said buffer circuit means is connected to sense the potential level of said input signal.

5. A system according to claim 1 wherein said buffer circuit means is connected to sense a potential level derived from said variable output of said electron discharge means.

6. A system according to claim 1 wherein said electron discharge means comprises first and second interconnected transistor devices, said first device being connected to receive said input signal as a control signal and said second device being connected to receive a signal derived from said output potential as a control signal.

7. A system according to claim 6 further including means connecting said buffer circuit for sensing a potential level from said input signal.

8. A system according to claim 6 further including means connecting said buffer circuit for sensing a potential level from said output potential.

9. A system according to claim 6 further including means connecting said buffer circuit for sensing a potential level from a junction treminal common to said transistor devices.

10. A system according to claim 9 wherein said transistor devices each include collector, base and emitter electrodes and said junction terminal is common to said emitter electrodes.

References Cited

UNITED STATES PATENTS

| | | | |
|---|---|---|---|
| 3,015,075 | 12/1961 | Bargellini | 330—22 X |
| 3,171,982 | 3/1965 | Ruhland | 330—40 X |
| 3,202,924 | 8/1965 | Myers et al. | 330—40 X |
| 3,374,442 | 3/1968 | Griffin | 330—40 |

ROY LAKE, Primary Examiner

S. H. GRIMM, Assistant Examiner

U.S. Cl. X.R.

330—25, 40, 127